United States Patent [19]
Weitzel et al.

[11] Patent Number: 5,119,149
[45] Date of Patent: Jun. 2, 1992

[54] GATE-DRAIN SHIELD REDUCES GATE TO DRAIN CAPACITANCE

[75] Inventors: Charles E. Weitzel; Vijay K. Nair, both of Mesa, Ariz.

[73] Assignee: Motorola, Inc., Schaumburg, Ill.

[21] Appl. No.: 600,947

[22] Filed: Oct. 22, 1990

[51] Int. Cl.⁵ .................... H01L 29/48; H01L 21/44
[52] U.S. Cl. ........................................... 357/15; 357/22; 357/23.9; 357/23.14; 357/52; 357/84; 437/184; 437/195; 437/912
[58] Field of Search ............... 357/22, 15, 23.9, 23.14, 357/84, 52; 437/184, 195, 912

[56] References Cited

U.S. PATENT DOCUMENTS

| | | | |
|---|---|---|---|
| 4,679,171 | 7/1987 | Logwood et al. | 357/84 |
| 4,914,491 | 4/1990 | Vu | 357/23.9 |
| 4,982,247 | 1/1991 | Aoki et al. | 357/15 |

*Primary Examiner*—Edward J. Wojciechowicz
*Attorney, Agent, or Firm*—Joe E. Barbee

[57] ABSTRACT

A gate-drain shield is used to reduce the gate to drain capacitance of a transistor. The gate-drain shield is formed as a conductor that is positioned on the surface of the transistor between the gate and the drain. The conductor is formed on an insulator thereby electrically insulating the conductor from the substrate of the transistor.

11 Claims, 1 Drawing Sheet

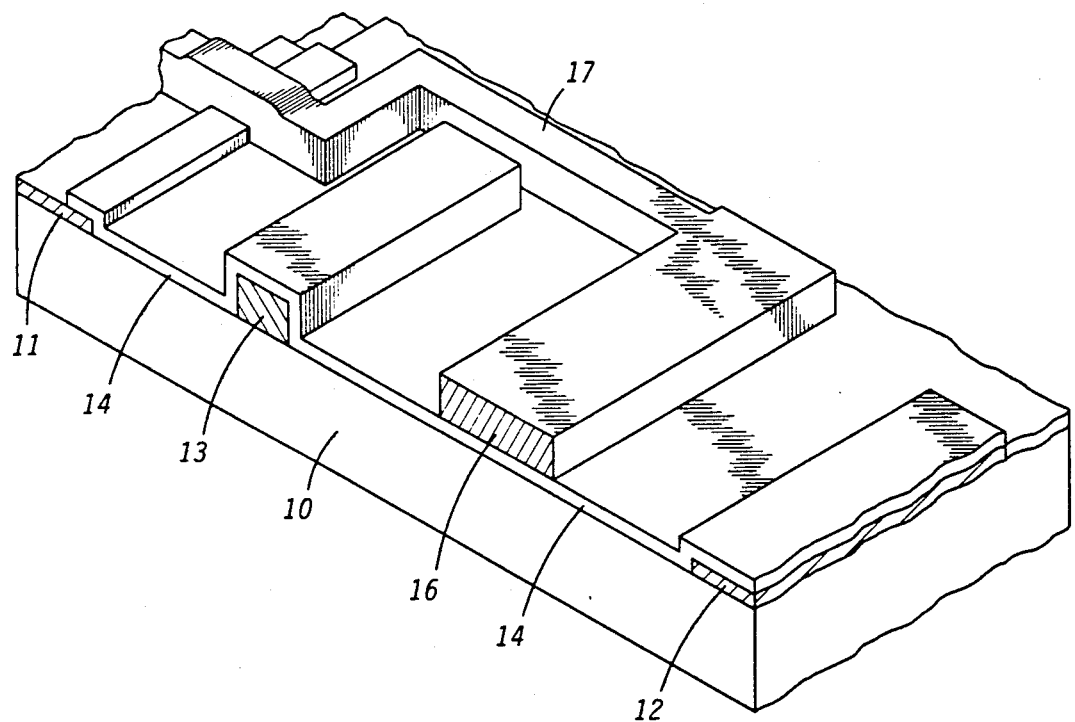

GATE-DRAIN SHIELD REDUCES GATE TO DRAIN CAPACITANCE

BACKGROUND OF THE INVENTION

The present invention relates, in general, to high frequency transistors, and more particularly, to a transistor structure that increases the high frequency stability and gain of the transistor.

Gallium Arsenide (GaAs) metal semiconductor field effect transistors (MESFETs) have been used in the industry for various applications including high frequency amplifiers that had low noise and high gain, and power amplifiers. Previous methods for implementing these MESFETs produced parasitic components that were detrimental to high frequency operation of the MESFET and limited the performance of amplifiers that used the MESFETs. The parasitic components made the MESFET unstable thereby creating oscillations in amplifiers using the MESFET. Previous methods to eliminate or reduce the oscillations involved connecting passive components that were lossy to the MESFETs. For example, a capacitor or inductor that exhibited resistive behavior at high frequencies may have been added to offset the effects of the parasitic components of the MESFET and make the amplifier more stable. Although these lossy components made the amplifier more stable, the lossy components dissipated power thereby reducing the power output of the amplifier and also reducing the gain of the amplifier. Since the noise figure of an amplifier is a function of the gain of the amplifier, the lossy components also increased the noise figure of the amplifier thereby reducing the effectiveness of the amplifier.

Accordingly, it would be desirable to have a MESFET that is more stable at high frequencies and also has more gain at those frequencies thereby eliminating the use of lossy components in some amplifiers and reducing the number of components used in others.

SUMMARY OF THE INVENTION

The objects and advantages of the present invention are achieved by creating a gate-drain shield that reduces the gate to drain capacitance of a transistor. The gate-drain shield is formed as a conductor that is positioned on the surface of the transistor between the gate and the drain. The conductor is formed on an insulator thereby electrically insulating the conductor from the substrate of the transistor.

BRIEF DESCRIPTION OF THE DRAWINGS

The sole Figure is an enlarged perspective cutaway view of a portion of a MESFET with a gate-drain shield in accordance with the present invention.

DETAILED DESCRIPTION OF THE DRAWINGS

The present invention provides a structure that improves the stability of a transistor at high frequencies and also improves the gain of the transistor at those frequencies by reducing the gate to drain capacitance of the transistor. The reduced capacitance is achieved by incorporating a gate-drain shield between the gate and the drain of the transistor.

While the invention is described with specific preferred embodiments, it is evident that many alternatives and variations will be apparent to those skilled in the semiconductor art. More specifically the invention has been described for a particular MESFET transistor structure, although the method is directly applicable to other MESFETs, as well as to heterostructure FETs (HFETs), and other transistor structures.

The stability of a transistor is generally described in terms of a stability factor K. For values of K less that one, the transistor is considered to be conditionally stable or stable for certain conditions. With conditional stability, it is always possible to connect certain external components which will cause the transistor to be unstable. For values of K greater than or equal to one, the transistor is unconditionally stable. The larger the value of K, the higher the stability of the transistor. Another important parameter of the transistor is the maximum stable gain (MSG). The maximum stable gain (MSG) for a transistor is the maximum gain that can be achieved for a stable amplifier that is built with the particular transistor. K and MSG are important parameters for evaluating transistors for use in high frequency amplifiers. MSG indicates the maximum gain that can be achieved in the amplifier, and K indicates at what frequencies external lossy components are required in order to stabilize the amplifier. Equations for K and MSG that are shown below express K and MSG in terms of parameters for a small signal circuit model of a MESFET:

$$MSG = \frac{f_T/f}{(C_{dg}/C_{gs}) + (1/(R_{ds} + 2\pi f_T C_{dg}))R_s}$$

$$K = (f_T/f) \frac{(2/R_{ds})(R_i + R_s + R_g + \pi f_T L_s) + 2\pi f_T C_{dg}(R_i + R_s + 2R_g + 2\pi f_T L_s)}{(C_{dg}/C_{gs}) + (1/(R_{ds} + 2\pi f_T C_{dg}))R_s}$$

where
 f = frequency of interest
 $C_{dg}$ = gate to drain capacitance of the transistor
 $C_{gs}$ = gate to source capacitance of the transistor
 $C_{ds}$ = drain to source capacitance of the transistor
 $R_{ds}$ = drain to source resistance of the transistor
 $R_s$ = source resistance of the transistor
 $R_i$ = internal charging resistance of the gate to source capacitor
 $R_g$ = gate resistance of the transistor
 $L_s$ = source inductance of the transistor
 $G_m$ = transconductance of the transistor
 $\pi$ = constant Pi (approximately 3.14)
 $f_T = G_m/2\pi C_{gs}$.

Analyzing these equations using computer modeling techniques shows that the only way to simultaneously increase the stability, K, and the maximum stable gain, MSG, is to reduce the gate to drain capacitance Cgd. This result is also shown by examining the equations for K and MSG. The denominator of both equations contains the term $C_{dg}/C_{gs}$. This term is usually larger than the term $(1/(R_{ds}+2\pi f_T C_{dg}))R_s$ that is also in the denominator. Therefore, the $C_{dg}/C_{gs}$ term dominates the expression for the denominator. Using $C_{dg}/C_{gs}$ as the denominator, it can be seen that decreasing $C_{dg}$ increases the stability of the transistor, K, and also increases the maximum stable gain, MSG.

Since the gate of a transistor is the input and the drain is the output, the gate to drain capacitance functions as a feedback element coupling the output back to the input. This feedback produces the unstable behavior. Therefore, reducing the gate to drain capacitance essentially reduces feedback from the transistor's output to the input thereby increasing the transistor's stability and gain.

The two main sources of a transistor's gate to drain capacitance ($C_{dg}$) are an inter-electrode capacitance between the gate metalization and the drain metalization, and a capacitive coupling between the gate and drain due to a space charge region in the semiconductor material. The space charge region in the semiconductor material extends from a point beneath the gate electrode a short distance toward the drain of the transistor.

The present invention reduces the gate to drain capacitance of a transistor by placing a gate-drain shield between the gate electrode and the drain electrode of the transistor. This gate-drain shield reduces the inter-electrode capacitance of the transistor.

Referring to the sole Figure, the present invention begins with a III-V compound semiconductor substrate 10 having a source electrode 11, a drain electrode 12, and a gate electrode 13. A dielectric 14 is applied to substrate 10 covering at least a portion of the substrate between gate 13 and drain 12. A conductor is applied on dielectric 14 between gate electrode 13 and drain electrode 12 to form a gate-drain shield 16. Generally, dielectric 14 is a portion of the standard processing of a transistor that provides a passivation layer covering substrate 10, gate electrode 13, source electrode 11, and drain electrode 12. As a minimum, dielectric 14 must at least cover the portion of substrate 10 beneath shield 16 and any conductor that connects to shield 16. In the preferred embodiment, gate electrode 13, source electrode 11, and drain electrode 12 are in contact with the substrate. Also in this preferred embodiment, dielectric 14 is a layer of silicon nitride which is approximately 2700 angstroms thick. Since shield 16 is insulated from substrate 10 by dielectric 14, shield 16 does not effect the channel of the transistor or the electron flow in the channel. If shield 16 were in contact with substrate 10, it would form another gate in addition to the one formed by gate electrode 13. Consequently, it is important that shield 16 be insulated from substrate 10 so that it does not function as a gate of the transistor or effect the d.c. (direct current or steady state) characteristics of the transistor.

A mechanism contributing to the gate to drain inter-electrode capacitance is electrical coupling between gate electrode 13 and drain electrode 12. A goal of shield 16 is to terminate the electric field lines that couple gate electrode 13 to drain electrode 12 thereby reducing the capacitive effect. With shield 16 in place, the gate to drain inter-electrode capacitance will be divided between a gate to shield capacitance and a drain to shield capacitance. Dividing the capacitance in this manner lowers the overall gate to drain capacitance, and increases both the stability and the gain of the transistor. Three of the parameters that determine the effectiveness of shield 16 are the placement, the size, and the voltage applied to shield 16. To insure the majority of the electric field lines terminate on shield 16, it should have a thickness or height at least equal to the thickness or height of the thicker of either gate electrode 13 or drain electrode 12. In the preferred embodiment, shield 16 has a thickness that is two times the thickness of gate electrode 13. For maximum effectiveness, the voltage applied to shield 16 should be less than the voltage applied to gate electrode 13 or drain electrode 12. Applying the most negative voltage to shield 16 reduces the inter-electrode capacitance between gate electrode 13 and drain electrode 12. If shield 16 is not connected to a voltage, shield 16 merely forms a plate of a capacitor that will add to the gate to drain capacitance as well as other parasitic capacitances. In the preferred embodiment, shield 16 is connected to source electrode 11 by conductor 17. Shield 16 may also be connected differently to provide a different voltage on the conductor. Placing shield 16 between gate electrode 13 and drain electrode 12 also increases the transistor's gate to source capacitance and drain to source capacitance. Since these capacitances effect the gain of the transistor, it is important to position shield 16 in a manner that minimizes the effect on these capacitances. In the preferred embodiment, shield 16 is centered between gate electrode 13 and drain electrode 16, and has a width that is equal to approximately one-third the distance between gate electrode 13 and drain electrode 16. This placement and size were selected to have the maximum effect on the gate to drain capacitance while minimizing the effect on the source to drain, and the gate to source capacitances.

By now it should be appreciated that there has been provided a novel way to fabricate a transistor having lower gate to drain capacitance and, therefore, a transistor having increased high frequency stability and gain. This transistor can be used to provide amplifiers that are stable at high frequencies, have high gain at those frequencies, and dissipate less power.

We claim:

1. A MESFET with a gate-drain shield to reduce gate to drain capacitance which comprises:
   a III-V compound semiconductor substrate having in contact with the substrate a gate electrode, a source electrode, and a drain electrode and having the gate electrode positioned on a surface of the substrate between the source and drain electrodes;
   a dielectric covering at least a portion of the gate electrode, at least a portion of the drain electrode, at least a portion of the substrate between the gate and drain electrodes, and at least a portion of the substrate between the source and the gate electrodes;
   a first conductor on the dielectric with the first conductor positioned between the gate electrode and the drain electrode wherein the first conductor forms the gate-drain shield that reduces capacitance between the gate electrode and the drain electrode of the MESFET; and
   a second conductor on the dielectric with the second conductor having a first connection to the source electrode and a second connection to the first conductor wherein the second conductor connects the gate-drain shield formed by the first conductor to the source electrode of the MESFET.

2. The MESFET of claim 1 wherein the first conductor has a thickness that is at least equal to the greater of either the thickness of the gate electrode or the thickness of the drain electrode.

3. The MESFET of claim 1 wherein the first conductor is approximately centered between the drain electrode and the gate electrode.

4. The MESFET of claim 1 wherein the first conductor has a width that is equal to approximately one-third the distance between the gate electrode and the drain electrode.

5. The MESFET of claim 1 wherein the dielectric is a layer of silicon nitride having a thickness of 2700 angstroms.

6. A transistor with increased stability and gain at high frequencies as a result of a gate-drain shield which comprises:
- a semiconductor substrate having in contact with a surface of the semiconductor substrate a source electrode, a drain electrode, and a gate electrode;
- a dielectric covering at least a portion of the substrate between the gate electrode and the drain electrode; and
- a conductor on the dielectric with the conductor positioned between the gate electrode and the drain electrode wherein the conductor forms a gate-drain shield that reduces capacitance between the gate electrode and the drain electrode.

7. The transistor of claim 6 further including the conductor connected to the source electrode.

8. The transistor of claim 6 further including the conductor coupled to a means for applying a voltage to the conductor.

9. A method for reducing gate to drain capacitance of a transistor which comprises:

- providing a III-V compound semiconductor substrate having in contact with the semiconductor substrate a gate electrode, a source electrode, and a drain electrode and also having a dielectric covering at least a portion of the substrate not covered by the gate electrode, the source electrode, and the drain electrode; and
- shielding the gate electrode from the drain electrode with a gate-drain shield that reduces the capacitance between the gate electrode and the drain electrode by terminating electric field lines that are between the gate electrode and the drain electrode wherein the gate-drain shield is a conductor that is on the dielectric and is positioned between the gate electrode and the drain electrode.

10. The method of claim 9 wherein the shielding the gate electrode step includes connecting the gate-drain shield to the source electrode.

11. The method of claim 9 wherein the shielding the gate electrode step includes connecting the gate-drain shield to a voltage.

* * * * *